(12) United States Patent
Kagaya et al.

(10) Patent No.: US 7,888,179 B2
(45) Date of Patent: Feb. 15, 2011

(54) SEMICONDUCTOR DEVICE INCLUDING A SEMICONDUCTOR CHIP WHICH IS MOUNTED SPANING A PLURALITY OF WIRING BOARDS AND MANUFACTURING METHOD THEREOF

(75) Inventors: Yutaka Kagaya, Tokyo (JP); Fumitomo Watanabe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 312 days.

(21) Appl. No.: 12/186,056

(22) Filed: Aug. 5, 2008

(65) Prior Publication Data

US 2009/0039506 A1 Feb. 12, 2009

(30) Foreign Application Priority Data

Aug. 6, 2007 (JP) ............... 2007-204177

(51) Int. Cl.
*H01L 21/00* (2006.01)
(52) U.S. Cl. .............. 438/113; 438/127; 438/462; 257/E21.499; 257/737; 257/784
(58) Field of Classification Search .......... 257/E23.023, 257/E21.502, E21.499, 737, 751, 782, 784, 257/787; 438/109, 112–114, 126, 127, 462, 438/465, 617, 668
See application file for complete search history.

(56) References Cited

U.S. PATENT DOCUMENTS

| | | | | |
|---|---|---|---|---|
| 6,064,111 | A * | 5/2000 | Sota et al. | 257/667 |
| 6,310,390 | B1 * | 10/2001 | Moden | 257/668 |
| 6,552,427 | B2 * | 4/2003 | Moden | 257/692 |
| 6,717,252 | B2 * | 4/2004 | Saeki | 257/686 |
| 6,879,030 | B2 * | 4/2005 | Tsai et al. | 257/680 |
| 6,882,021 | B2 * | 4/2005 | Boon et al. | 257/434 |
| 6,903,449 | B2 * | 6/2005 | Kim et al. | 257/666 |
| 7,061,085 | B2 * | 6/2006 | Moxham | 257/684 |
| 7,268,018 | B2 * | 9/2007 | Moxham | 438/118 |
| 7,364,948 | B2 * | 4/2008 | Lai et al. | 438/112 |
| 7,514,299 | B2 * | 4/2009 | Lin et al. | 438/126 |
| 7,521,794 | B2 * | 4/2009 | Yee et al. | 257/720 |
| 7,537,966 | B2 * | 5/2009 | Connell et al. | 438/126 |
| 7,679,172 | B2 * | 3/2010 | Huang et al. | 257/678 |
| 7,692,313 | B2 * | 4/2010 | Fan | 257/779 |
| 2004/0171191 | A1 * | 9/2004 | Connell et al. | 438/112 |
| 2008/0237855 | A1 * | 10/2008 | Fan et al. | 257/738 |

FOREIGN PATENT DOCUMENTS

JP 2001-044324 2/2001

\* cited by examiner

*Primary Examiner*—Chris Chu
(74) *Attorney, Agent, or Firm*—Young & Thompson

(57) ABSTRACT

The semiconductor device is made up of two wiring boards, a semiconductor chip, and a sealing part. The two wiring boards are spaced apart, and a semiconductor chip is mounted so as to span the two wiring boards. The semiconductor chip includes a predetermined circuit and a plurality of electrode pads on one side thereof. The wiring board includes a plurality of connection pads on a semiconductor chip-mounting face, and a plurality of lands on the opposite side thereof. The land is electrically connected to a corresponding connection pad. An external terminal is formed on each of the lands. Further, the electrode pad formed in the semiconductor chip is electrically connected to the corresponding connection pad of the wiring board. Moreover, the semiconductor chip, the semiconductor chip mounting face of the wiring board, and the side faces of the wiring board are covered with the sealing part.

15 Claims, 10 Drawing Sheets

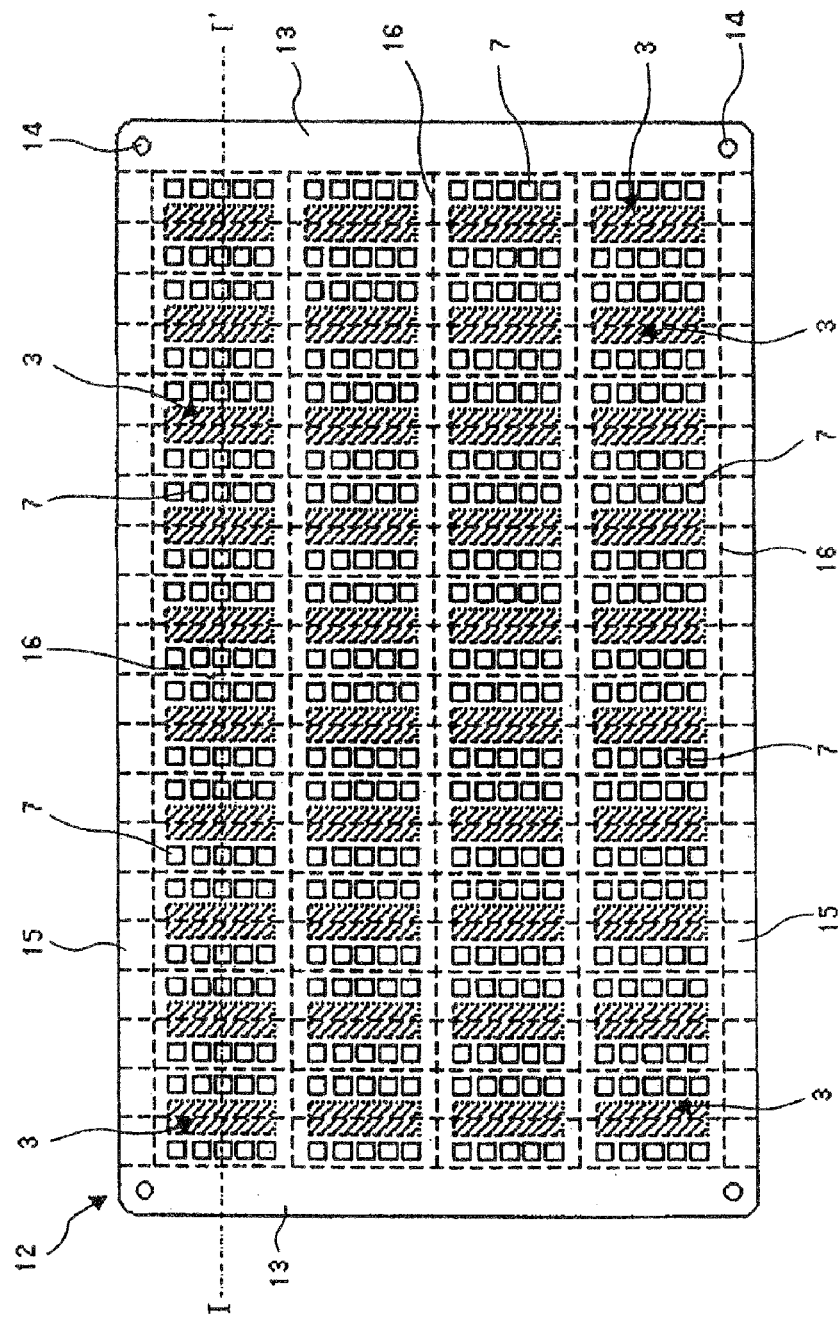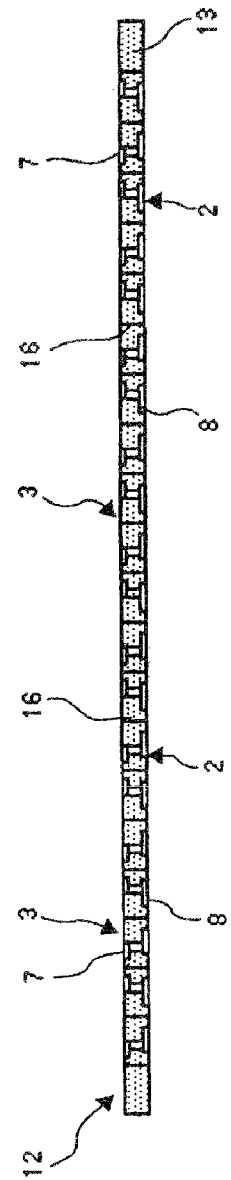
Fig. 3A
Fig. 3B

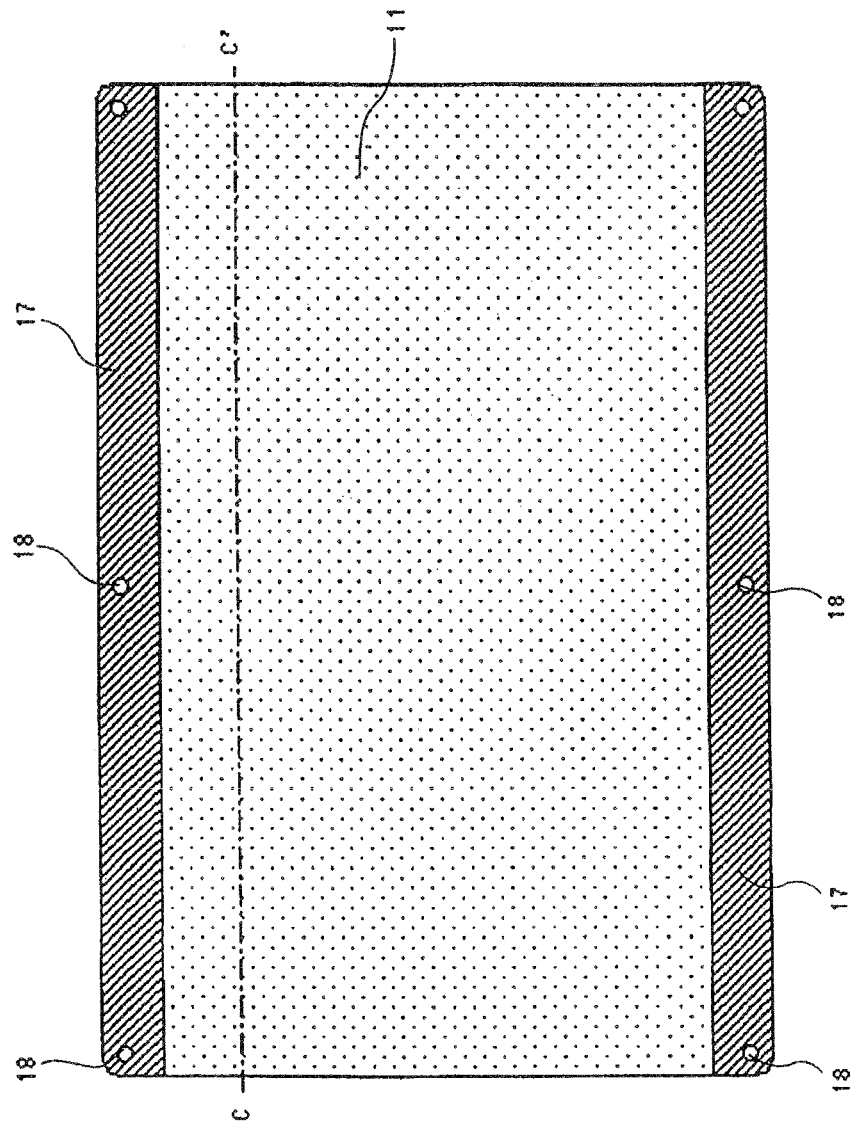
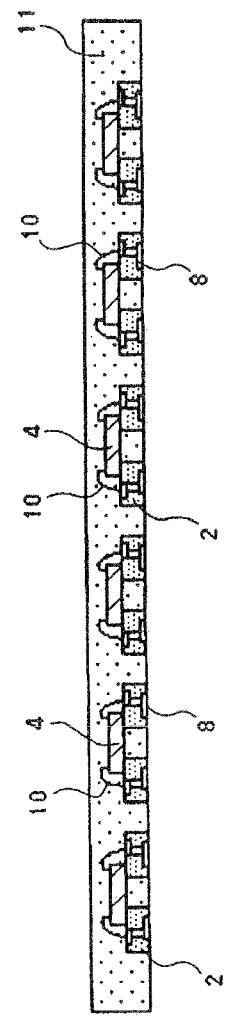
Fig. 6A
Fig. 6B

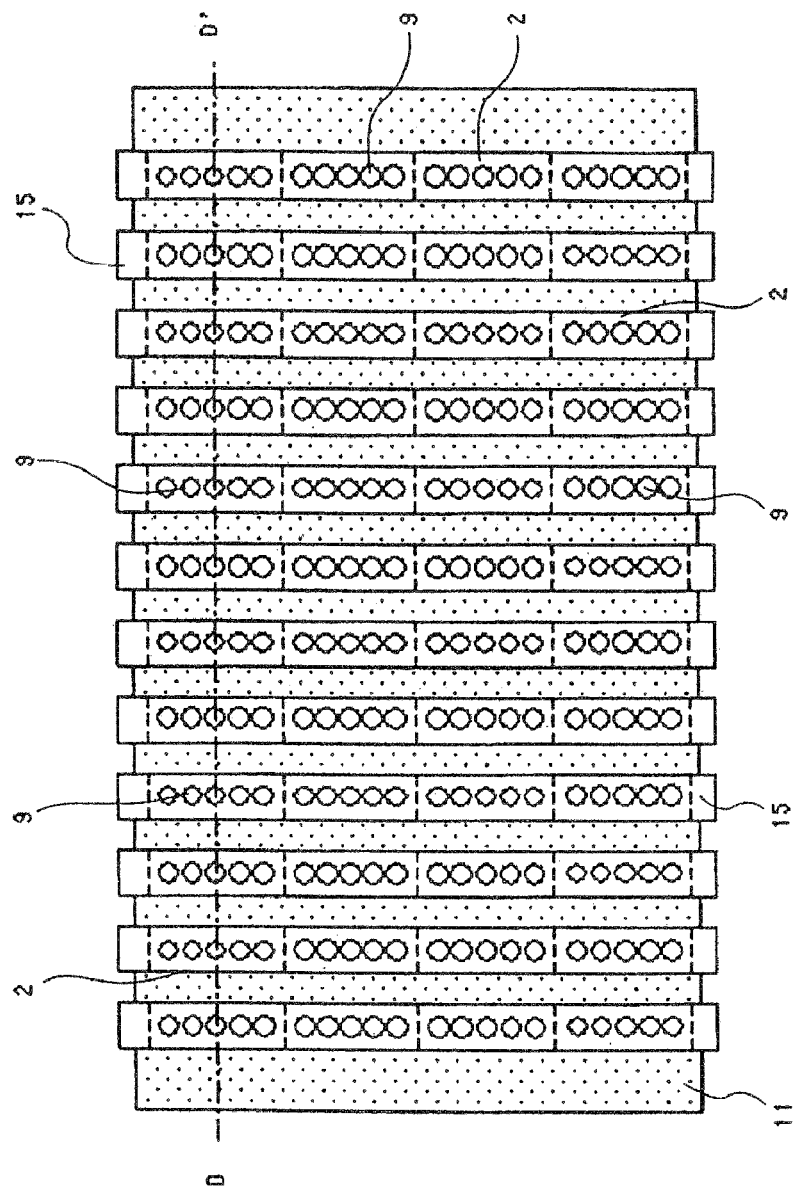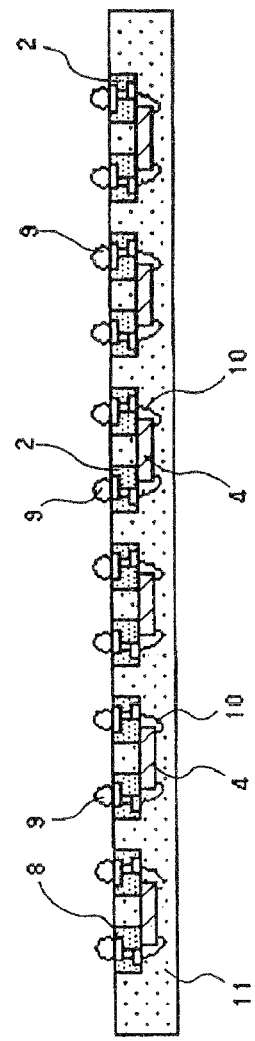
Fig. 7A
Fig. 7B

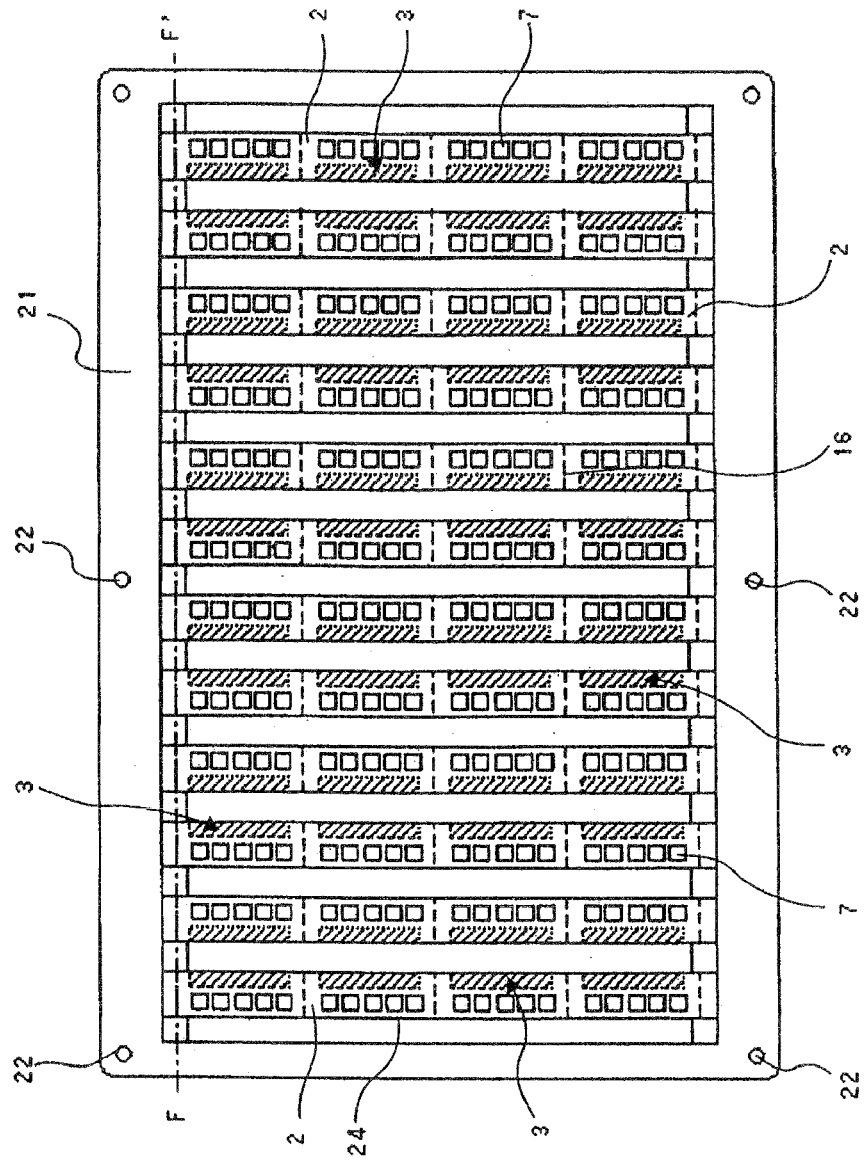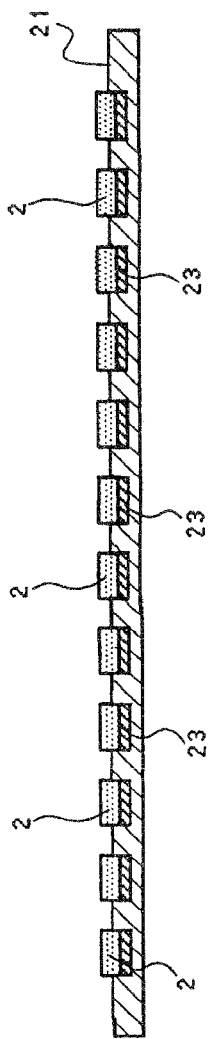
Fig. 9A
Fig. 9B

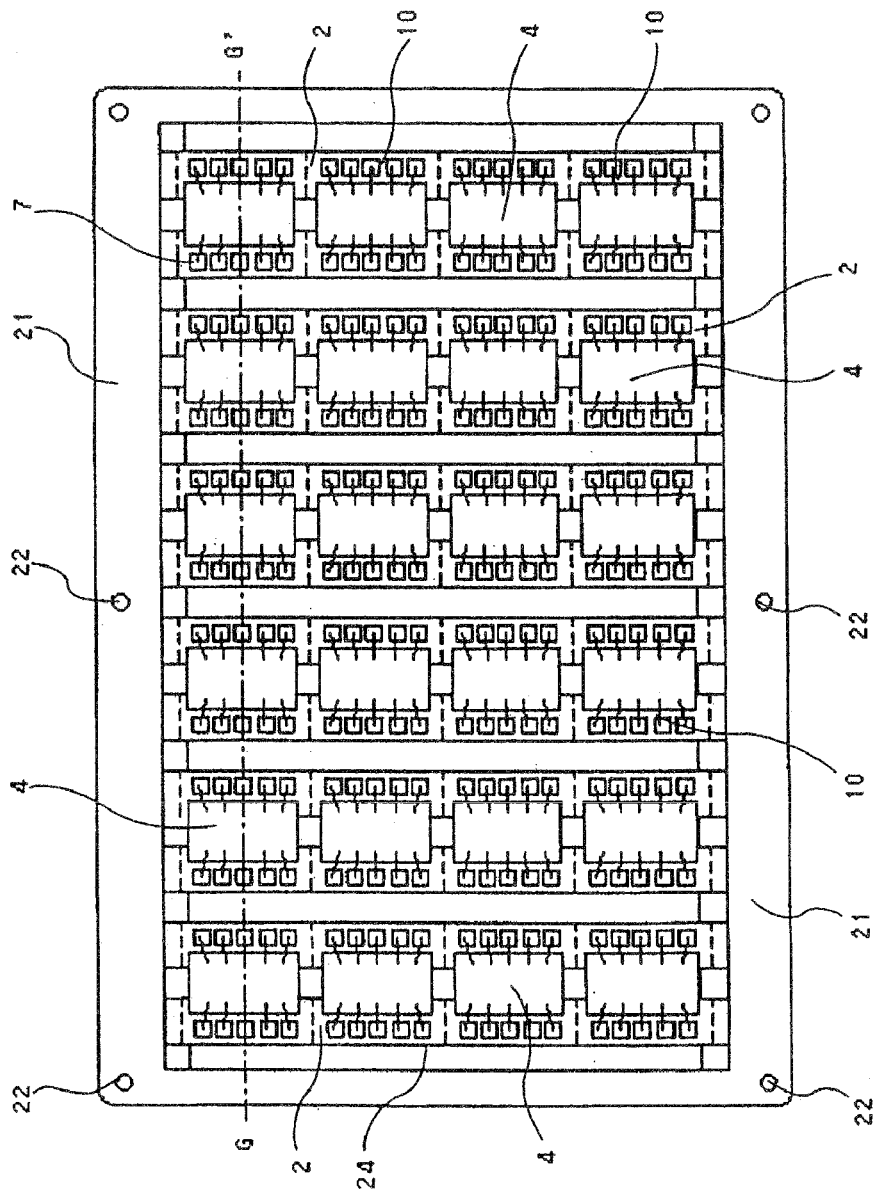
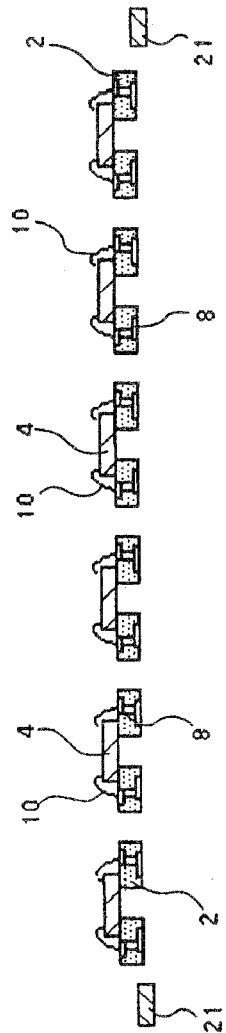
Fig. 10A
Fig. 10B

SEMICONDUCTOR DEVICE INCLUDING A SEMICONDUCTOR CHIP WHICH IS MOUNTED SPANING A PLURALITY OF WIRING BOARDS AND MANUFACTURING METHOD THEREOF

This application is based upon and claims the benefit of priority from Japanese patent application No. 2007-204177, filed on Aug. 6, 2007, the disclosure of which is incorporated herein in its entirety by reference.

BACKGROUND OF THE INVENTION

1. Field of the Invention

The present invention relates to a sealed semiconductor device and a method of manufacturing the semiconductor device.

2. Description of the Related Art

In recently years, as the technology develops, semiconductor devices utilizing a wiring board have been put into practical use. Conventionally, BGA (Ball Grid Array) type semiconductor devices are known. The BGA type semiconductor device comprises a wiring board for mounting a semiconductor chip, wires for connecting the wiring board and the semiconductor chip, sealing resin for protecting the semiconductor chip from the outer environment, and a solder ball as an external terminal.

The BGA type semiconductor devices are manufactured as follows. First, a semiconductor chip is mounted on a single wiring board of an integral molding type, and next the semiconductor chip and the wiring board are connected by wires made of materials such as gold (Au). Then, a sealing part is formed by an integral molding method, thereafter solder balls are mounted, and finally the wiring board is cut along the external shape of the semiconductor device.

In a BGA (Ball Grid Array) type semiconductor device which adopts the above-mentioned method of forming a sealing part in an integral manner, there is a difference in the thermal expansion coefficients between the sealing resin that is formed to cover the semiconductor chip on the wiring board and the wiring board. As a result, when subjected to a sealing step involving heat generation, the wiring board will exhibit warping. When such warping of the wiring board is large, handling and positioning of the wiring board will become difficult in the manufacturing process of the semiconductor device. Therefore, there is the problem in which productivity in manufacturing a semiconductor device declines.

Techniques to solve such warping of the wiring board include a method to divide the sealing part into two or more sections (see Japanese Published Unexamined Patent Application No. 2001-44324). Dividing the sealing part into two or more sections will lessen the warping of the wiring board compared with the case in which the sealing part is in a single section.

Even when the sealing part is divided into two or more sections, the sealing part is formed across the wiring board when viewed as a unit product. Therefore, the problem of warping of the wiring board will be caused when the area of the sealing part is large. The larger the area of the wiring board, the larger is the warping of the wiring board.

Further, the warping of the wiring board can be lessened by dividing the sealing part further into more sections; however, in such a case, the region of the wiring board where the sealing part is not formed will increase. The region where the sealing part is not formed is a portion at which the upper and lower molding dies are brought into contact when applying resin sealing. That is, the product can not be formed in the region. Therefore, the number of semiconductor devices formed from one wiring board will be decreased. Such decrease in the number of semiconductor devices produced from a single wiring board will result in an increase in the manufacturing cost of semiconductor device.

SUMMARY

The present invention seeks to solve one or more of the above problems, or to improve upon those problems at least in part.

The semiconductor device in one exemplary embodiment of the present invention comprises a plurality of wiring boards, a semiconductor chip that is mounted and that spans the plurality of wiring boards, and a sealing part. The wiring boards, each of which includes a land, are spaced apart from each other. The semiconductor chip is electrically connected to the land. The sealing part at least covers the semiconductor chip and the semiconductor chip mounting face of the wiring board.

Further, the method of manufacturing a semiconductor device of the present embodiment comprises a board preparation step, a disposition step, a chip mounting step, an electrical connection step, a sealing step, an external terminal mounting step, and a board division step. In the board preparation step, a wiring motherboard formed with a plurality of wiring boards is prepared. Connection pads are formed on one side of wiring boards and the wiring boards have lands electrically connected to the connection pads. In the disposition step, the wiring motherboard is divided into a plurality of divided boards which include at least one wiring board and the divided boards are respectively disposed in a spaced apart state.

In the chip mounting step, a semiconductor chip is mounted onto a plurality of wiring boards in such a way as to span at least two divided boards. In the electrical connection step, the connection pads of the wiring boards are electrically connected with the semiconductor chip. In the sealing step, a sealing part is formed in such a way as to cover at least the semiconductor chip and the semiconductor chip mounting face of the wiring board. In the external terminal mounting step, an external terminal is formed on the land. In the board division step, the divided boards and the sealing part are cut off to separate semiconductor devices.

The above and other objects, features and advantages of the present invention will become apparent from the following description with reference to the accompanying drawings which illustrate examples of the present invention.

BRIEF DESCRIPTION OF THE DRAWINGS

The above features and advantages of the present invention will be more apparent from the following description of certain preferred embodiments taken in conjunction with the accompanying drawings, in which:

FIG. 3A is a schematic diagram of a wiring motherboard used for the manufacturing of a semiconductor device according to the exemplary embodiment of the present invention;

FIG. 3B is a sectional view of FIG. 3A when taken along I-I' line in this figure;

FIG. 6A is a conceptual diagram to show the manufacturing procedure of a semiconductor manufacturing method according to an embodiment of the present invention;

FIG. 6B is a sectional view of FIG. 6A when taken along line C-C' in this figure;

FIG. 7A is a conceptual diagram to show the manufacturing procedure of a semiconductor manufacturing method according to the exemplary embodiment of the present invention;

FIG. 7B is a sectional view of FIG. 7A when taken along line D-D' in this figure;

FIG. 9A is a conceptual diagram to show the manufacturing procedure of a semiconductor manufacturing method according to the exemplary embodiment of the present invention;

FIG. 9B is a sectional view of FIG. 9A when taken along line F-F' in this figure;

FIG. 10A is a conceptual diagram to show the manufacturing procedure of a semiconductor manufacturing method according to the exemplary embodiment of the present invention;

FIG. 10B is a sectional view of FIG. 10A when taken along line G-G' in this figure;

DETAILED DESCRIPTION OF THE EXEMPLARY EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment of the Semiconductor Device

Figure 1:
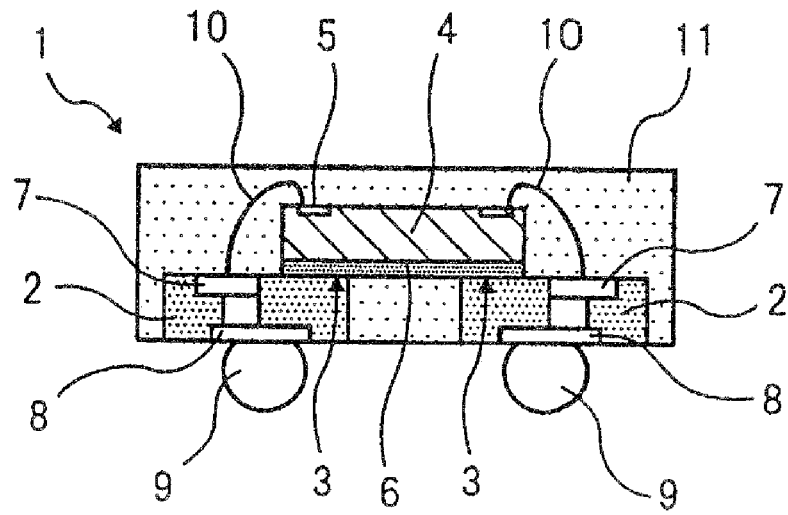
FIG. 1 is a conceptual diagram to illustrate a semiconductor device according to one exemplary embodiment of the present invention.

FIG. 1 is a sectional view to show the configuration of the semiconductor device according to a first embodiment of the present invention. Semiconductor device 1 comprises two wiring boards 2 having a generally rectangular plate shape, semiconductor chip 4, and sealing part 11 for sealing and protecting semiconductor device 1. In the present embodiment, two wiring boards 2 are spaced apart such that the long sides of wiring boards 2 are approximately parallel with each other. Wiring boards 2 include chip-mounting part 3 respectively in the vicinity of the long sides that are opposed to each other on the two spaced-apart wiring boards 2. As wiring board 2, for example, a glass epoxy board may be used.

Further, semiconductor chip 4 is mounted so as to span chip-mounting parts 3 on two wiring boards 2. Semiconductor chip 4 has a generally rectangular plate shape, and includes on one side thereof a predetermined circuit and a plurality of electrode pads 5. Further, semiconductor chip 4 includes adhesive member 6 on the surface in contact with wiring board 2. As adhesive member 6, DAF (Die Attached Film) can be used. Semiconductor chip 4 is secured to chip-mounting part 3 on wiring board 2 by adhesive member 6.

Wiring board 2 includes a plurality of connection pads 7 in the vicinity of chip-mounting part 3. Further, wiring board 2 includes a plurality of lands 8 on the face opposite to the face where chip-mounting part 3 is provided. Land 8 is electrically connected to corresponding connection pad 7 by using a surface wiring provided on wiring board 2 or by using an internal conductor such as a through hole. Further, each of lands 8 is connected with external terminal 9. In the present embodiment, a bump electrode is used as external terminal 9. As the bump electrode, for example, a conductive material such as solder can be used. Furthermore, in the present embodiment, external terminals 9 are disposed in a line along the long side of wiring board 2; however, external terminals 9 may be disposed in a grid pattern. Moreover, a plurality of lands 8 may not be disposed on the face opposite to the face where chip-mounting part 3 of wiring board 2 is provided.

Electrode pad 5 formed on semiconductor chip 4 is electrically connected to corresponding connection pad 7 formed on wiring board 2 by using conductive wire 10. As conductive wire 10, for example gold (Au) may be used.

Moreover, semiconductor chip 4, semiconductor chip 4 mounting face of wiring board 2, the side faces of wiring board 2, and wire 10 are covered with sealing part 11. Sealing part 11 is preferably made of a thermosetting resin such as for example epoxy resin.

Configuring the semiconductor device as described above will lessen the warping of the wiring board caused by the difference in the thermal expansion coefficient between the wiring board and the sealing part in a resin sealing step. As a result, a semiconductor device having a highly accurate external dimension will be obtained. Further, since the area of the wiring board used for one semiconductor device becomes smaller, the cost of the semiconductor device can be reduced. Moreover, since the sealing part is formed on the side surface the wiring board as well, there is the effect of preventing the wiring board from coming out from the semiconductor device. Furthermore, forming the lands in a grid pattern makes it possible to increase the number of pins of the semiconductor device.

Second Embodiment of Semiconductor Device

Figure 2:
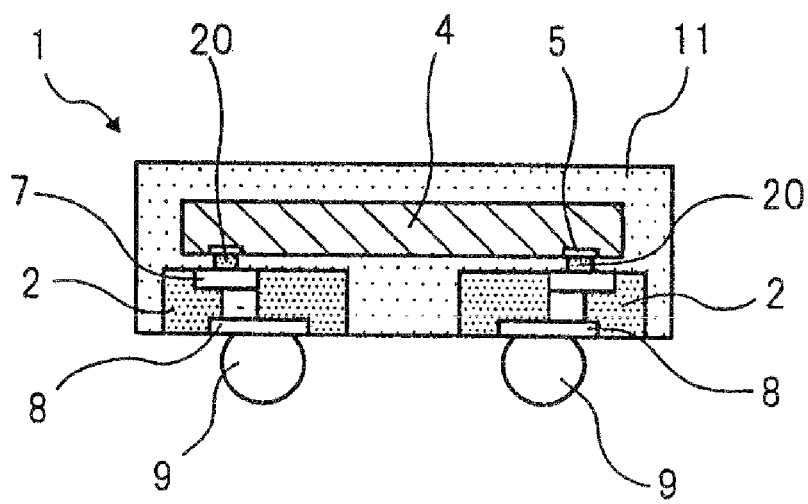
FIG. 2 is a conceptual diagram to illustrate a semiconductor device according to another exemplary embodiment of the present invention.

FIG. 2 is a sectional view to show the configuration of a semiconductor device relating to a second embodiment of the present invention. Semiconductor device 1 in the second embodiment comprises two wiring boards 2 having a generally rectangular plate shape, semiconductor chip 4, and sealing part 11 for sealing and protecting semiconductor device 1. Two wiring boards 2 are spaced apart such that the long sides of wiring boards 2 are approximately parallel with each other. Wiring board 2 includes a chip-mounting part on one side thereof. Then, semiconductor device 1 is provided with a plurality of connection pads 7 as the chip-mounting part for wiring board 2.

Semiconductor chip 4 is mounted so as to span chip-mounting parts on two wiring boards 2. Semiconductor chip 4 is mounted such that one side thereof on which a predetermined circuit and a plurality of electrode pads 5 are formed faces wiring board 2, and is electrically connected to wiring board 2 via bump electrode 20 formed on electrode pad 5 (flip-chip implementation).

Wiring board 2 includes a plurality of lands 8 on the face opposite to the face where connection pads 7 are provided. Land 8 is electrically connected to corresponding connection pad 7 by using wiring provided in wiring board 2 etc. External terminal 9 is formed on each land 8. Although, in the present embodiment, external terminals 9 are disposed in a line along the long side of wiring board 2, external terminals 9 may be disposed in a grid pattern.

Further, semiconductor chip 4, the semiconductor chip mounting face of wiring board 2, and the side faces of wiring board 2 are covered with sealing part 11. Sealing part 11 is preferably made of a thermosetting resin such as for example epoxy resin.

Based on the above described configuration of a semiconductor device, the warping of wiring board will be lessened according to with the above described first embodiment, and semiconductor devices having a highly accurate external dimension will be obtained. Further, since the area of a wiring board used for one semiconductor device becomes smaller, the cost of the semiconductor device can be reduced.

Further, the method of mounting semiconductor chips may be a flip-chip implementation. In a flip-chip implementation, since a semiconductor chip can be mounted onto a connection pad of the wiring board, it is possible to reduce the size of the semiconductor device. Further, in a flip-chip implementation, since there is no need for conductive wires protruding to the top of the semiconductor chip, it is also possible to reduce the thickness of the semiconductor device.

Moreover, since wiring boards are spaced apart, the gap which is formed between the wiring board and the semiconductor chip and into which sealing resin is to be charged becomes larger. Therefore, when performing sealing, there is no need of applying an under-fill which has been conventionally employed in the flip-chip implementation. Thus, it is possible to charge a sealing resin in between the wiring board and the semiconductor chip within a short time in an integral manner and in an easy fashion.

First Embodiment of Method of Manufacturing a Semiconductor Device

First embodiment of method of manufacturing the semiconductor which has been described in the first embodiment of the semiconductor device will be described. FIGS. 3 to 8 illustrate the manufacturing steps of the method of manufacturing semiconductor device of the present invention.

First, as a board preparation step, a plurality of wiring boards on one side of which connection pads are formed and on the other side of which lands that are electrically connected with the connection pads are formed, are prepared. FIG. 3A is a schematic diagram to show a prepared wiring motherboard. FIG. 3B is a sectional view of the wiring motherboard taken along I-I' line in FIG. 3A.

Wiring motherboard 12 has a generally rectangular plate shape. Among the sides corresponding to the four edges of wiring motherboard 12, the short sides provide frame part 13. The frame part 13 is provided with positioning holes 14. Further, among the sides corresponding to the four edges of wiring motherboard 12, the long sides are provided with holding parts 15. Further, in the center area that is an area except for the vicinity of the four edges of wiring motherboard 12, a plurality of wiring boards 2 are disposed in a grid pattern. Moreover, on the boundaries of the plurality of wiring boards 2, dicing line 16 is formed for use in cutting wiring motherboard 12. Dicing line 16 is preferably formed in the directions respectively parallel with the short side and the long side of wiring motherboard 12. In the present embodiment, wiring boards 2 are disposed in a line in a region surrounded by dicing lines 16 formed in the direction parallel with the short side. As wiring motherboard 12, for example, a glass epoxy board is used but other material may be used.

Each wiring board 2 includes in one side thereof chip-mounting part 3 and a plurality of connection pads 7. Moreover, a plurality of lands 8 are formed in the side opposite to the side where chip-mounting part 3 of wiring board 2 is formed. Connection pads 7 and lands 8 are electrically connected.

Figure 4A:
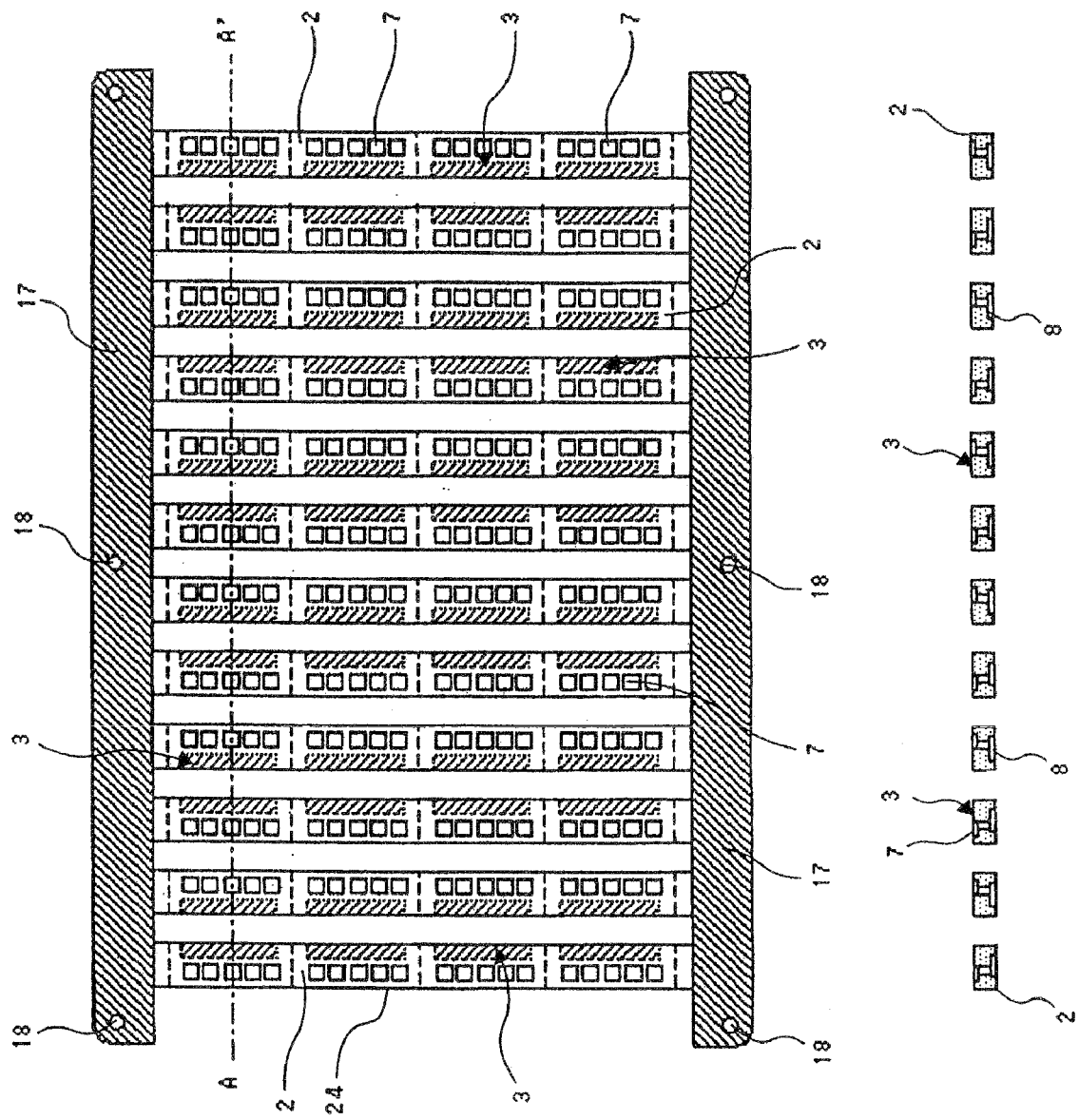
FIG. 4A is a conceptual diagram to show the manufacturing procedure of a semiconductor manufacturing method according to an exemplary embodiment of the present invention.
Figure 4B:
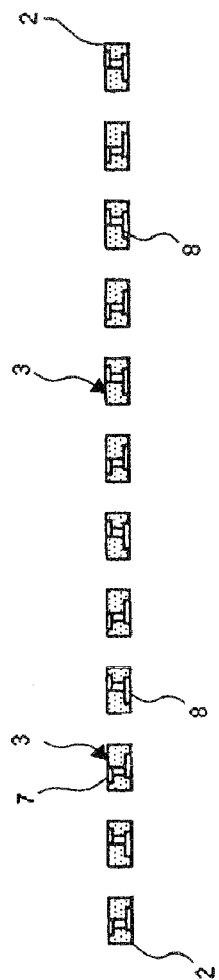
FIG. 4B is a sectional view of FIG. 4A when taken along line A-A' in this figure.

Next, a disposition step in which wiring boards are disposed to be spaced apart will be described. FIG. 4A is a schematic diagram to show a state after the disposition step has been completed. Moreover, FIG. 4B is a sectional view when taken along line A-A' in FIG. 4A.

Wiring motherboard 12 prepared in the board preparation step is bonded to a dicing tape, and thereafter is rotary cut by a dicing blade rotating at a high speed. Thereby, the dicing lines, that are formed in the direction parallel with the short side of wiring motherboard 12, are cut. After cutting, divided boards 24 separated into strips are picked up from the dicing tape. Divided board 24 separated into a strip includes holding part 15 at both ends thereof. Thus, a plurality of divided boards 24 in which a plurality of wiring boards are disposed in a line are obtained.

Next, these divided boards 24 are disposed at a predetermined spacing and holding parts 15 on both ends of divided board 24 are secured by board fixing jig 17. Jig 17 includes positioning holes 18. Thereby, the positioning of divided boards 24 secured onto jig 17 can be done and the transport of divided boards 24 is enabled.

In the present embodiment, one semiconductor chip is mounted so as to span two wiring boards 2. For that purpose, divided boards 24 are spaced apart such that chip-mounting parts 3 of wiring boards 2 formed on two divided boards 24 face each other. Further, the spacing between spaced apart divided boards 24 is appropriately chosen in accordance with the size of the semiconductor chip and so on.

Figures 5A, 5B:
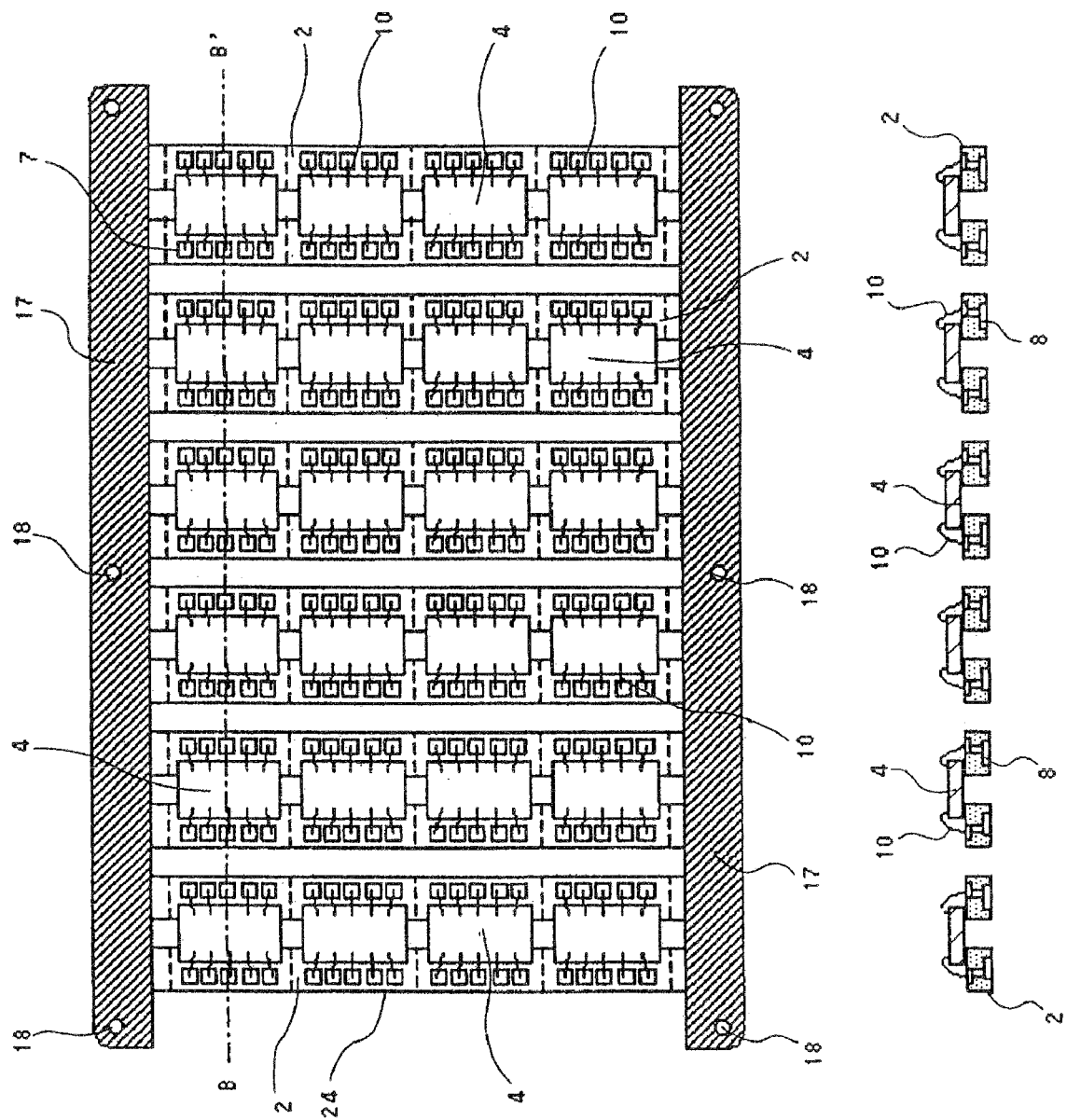
FIG. 5A is a conceptual diagram to show the manufacturing procedure of a semiconductor manufacturing method according to the exemplary embodiment of the present invention.
FIG. 5B is a sectional view of FIG. 5A when taken along line B-B' in this figure.

Next, a chip-mounting step will be described. FIG. 5A is a schematic diagram to show a state after the chip-mounting step and the electrical connection step have been completed. Further, FIG. 5B is a sectional view when taken along line B-B' in FIG. 5A. First, semiconductor chip 4 formed with a predetermined circuit and electrode pads are prepared. A desired circuit and electrode pads are formed through steps such as diffusion on one side of a circular substrate obtained by slicing a silicon ingot which is fabricated by a single crystal pulling method or the like, and the thus obtained semiconductor wafer is cut to obtain semiconductor chip 4.

In the chip-mounting step, semiconductor chip 4 is mounted onto chip-mounting parts 3 of two wiring boards 2 so as to span at least two divided boards 24.

Semiconductor chip 4 is formed with an insulating adhesive member. This adhesive member secures semiconductor chip 4 to wiring board 2. As the adhesive member, DAF which is a film-like adhesive member can be used. Although, in this embodiment, DAF is used as the adhesive member, any material can be used provided it can secure semiconductor chip 4.

Next, as an electrical connection step, a wire bonding step will be described. In the wire bonding step, connection pad 7 of wiring board 2 and the electrode pad of semiconductor chip 4 corresponding to the connection pad are connected by using conductive wire 10 made of gold (Au) etc. For example, it is possible that the tip of wire 10 is melted to form a ball, and thereafter is connected to an electrode pad by ultrasonic compression, or the like. Thereafter, the rear end of wire 10 is connected to the connection pad of wiring board by ultrasonic compression, or the like.

Although, in the present embodiment, the chip-mounting step and the electrical connection step are performed as described above, the configuration may also be such that a semiconductor chip is mounted so that the side on which electrode pads are formed faces the wiring board, and the semiconductor chip and the wiring board are electrically connected through a bump electrode formed on the electrode pad (flip-chip implementation).

Next, a sealing step will be described. FIG. 6A is a schematic diagram to show a state after the sealing step has been completed. FIG. 6B is a sectional view when taken along line C-C' in FIG. 6A. In the sealing step, first, divided boards 24 secured to a board fixing jig are clamped via a sheet molding tape by the upper and lower molds of a molding apparatus for performing sealing. Then, molten thermosetting resin is injected into the cavity formed by the upper and lower molds. Then, curing is performed with the cavity being filled with thermosetting resin to harden the thermosetting resin. In this way, sealing part 11 is formed in an integral manner so as to cover semiconductor chip 4, the semiconductor chip mounting face of wiring board 2, the side faces of wiring board 2, and wire 10. As the thermosetting resin, epoxy resin etc. can be used. After sealing part 11 is formed, board fixing jig 17 is detached.

Since sealing part 11 is formed on the side faces of wiring board 2 as well, it has an effect of preventing wiring board 2 from coming out from semiconductor device 1.

Further, in the board preparation step, when cutting the wiring motherboard, blades having a different cutting width may be used to cut it in two stages so that a step portion is formed at an end part of the wiring board. Forming a step portion at an end part of the wiring board as described above and forming a sealing resin so as to cover the aforementioned end part will further enhance the effect of preventing the wiring board from coming out.

Further, when performing the sealing with resin in an integral manner, use of a sheet molding tape will make resin burrs less likely to be formed on the land of the wiring board. Further, ensuring that the sealing part is not formed on the board fixing jig will allow the reuse of the jig.

Next, an external terminal mounting step will be described. FIG. 7A is a schematic diagram to show a state after the external terminal mounting step has been completed. Further, FIG. 7B is a sectional view when taken along line D-D' of FIG. 7A. In the external terminal mounting step, a bump electrode is formed by mounting a conductive metal ball as external terminal 9 on land 8 of wiring board 2. For example, after flux is transferred to a metal ball made of solder etc., the metal ball is mounted to land 8 and thereafter the metal ball is reflown to form external terminal 9.

Figure 8A:
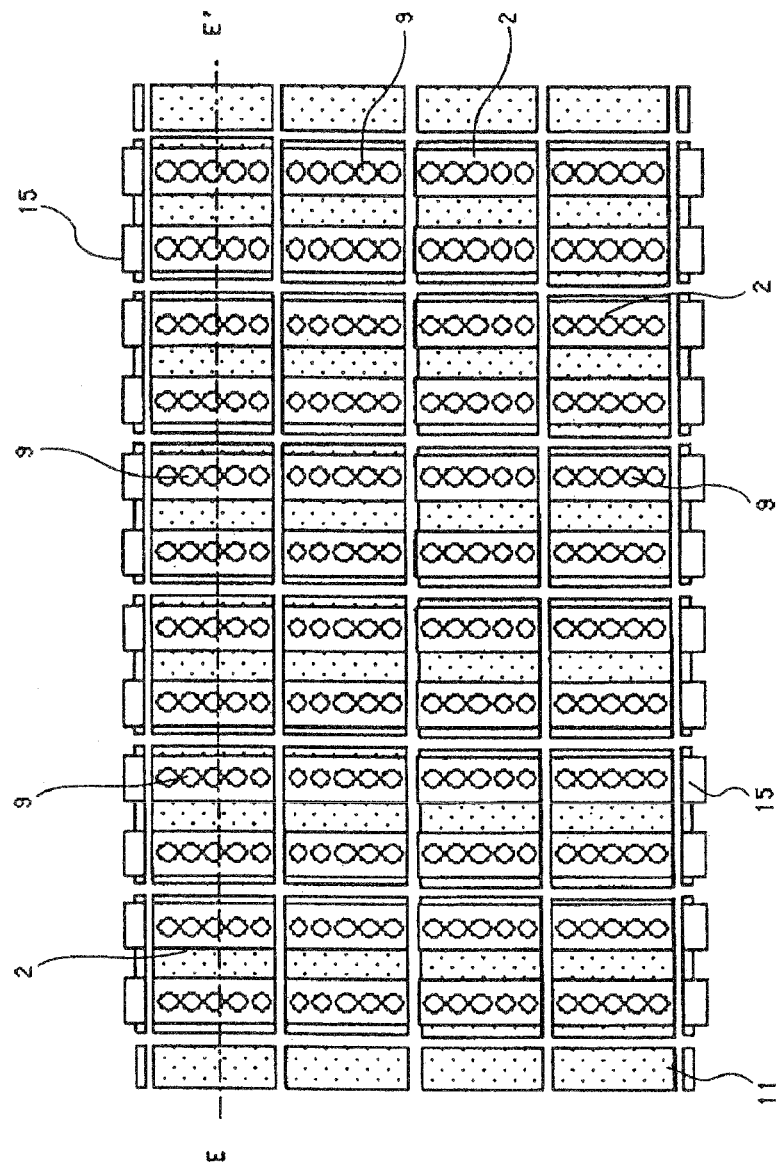
FIG. 8A is a conceptual diagram to show the manufacturing procedure of a semiconductor manufacturing method according to the exemplary embodiment of the present invention.
Figure 8B:
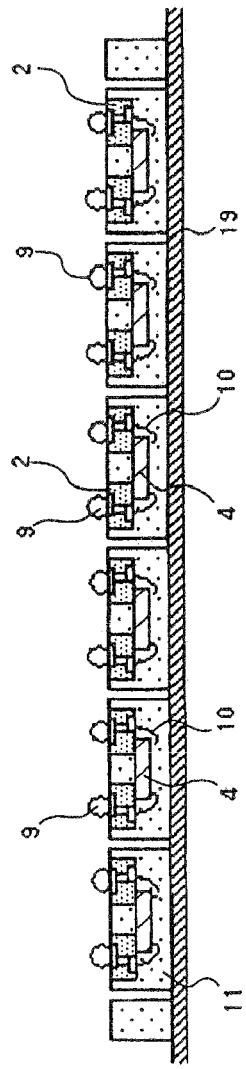
FIG. 8B is a sectional view of FIG. 8A when taken along line E-E' in this figure.

Finally, a board division step will be described. FIG. 8A is a schematic view to show a state after the board division step has been completed. FIG. 8B is a sectional view when taken along line E-E' of FIG. 8A. In the board division step, sealing part 11 and divided board 24 are cut so that they are separated into individual semiconductor devices. Sealing part 11 and divided board 24 are separated by being rotary cut by a dicing blade rotating at a high speed, with divided board 24 formed with sealing part 11 is bonded to dicing tape 19. After separation, semiconductor device 1 is picked up from dicing tape 19 thereby obtaining the semiconductor device of the first embodiment shown in FIG. 1.

According to the semiconductor device of the present configuration, the warping of the wiring board caused by the difference in thermal expansion coefficient between the wiring board and the sealing part is lessened. This will mitigate problems in the transport of wiring boards in the manufacturing process thereby enhancing the manufacturing productivity of semiconductor devices. Since the warping of the wiring board is lessened, the accuracy of dicing in the board division step will be improved, thereby allowing semiconductor devices having a highly accurate external dimension to be manufactured.

Further, since the area of the wiring board occupied by a single semiconductor device becomes smaller, the number of semiconductor devices obtained from a wiring motherboard of a fixed size will increase. Such an increase in the obtainable number of semiconductor devices will make it possible to reduce the manufacturing cost of semiconductor devices.

Further in the board preparation step, when a defect exists in a strip-shaped wiring board, it is possible to reduce the number of defective semiconductor devices by disposing strip-shaped wiring boards having a defect at the same position that are to be spaced apart.

Second Embodiment Method of Manufacturing Semiconductor Device

Second embodiment of method of manufacturing the semiconductor which has been described in the first embodiment of the semiconductor device will be described. FIGS. 9 to 11 are step diagrams to illustrate the manufacturing processes of the method of manufacturing a semiconductor device of the present invention.

A board preparation step will now be described. First, in the same way to the first embodiment of the method of manufacturing semiconductor device, a wiring motherboard is prepared. The wiring motherboard to be prepared in the present embodiment does not need a board-fixing holding part.

Next, a disposition step in which wiring boards are disposed to be spaced apart will be described. FIG. 9A is a schematic diagram to show the state after the disposition step has been completed. Moreover, FIG. 9B is a sectional view when taken along line F-F' in FIG. 9A. First, in the same way to the first embodiment of the method of manufacturing semiconductor device, the wiring motherboard is cut along a dicing line to fabricate a plurality of divided boards separated into a strip-shape. In the present embodiment, carrier 21 including adherent resin 23 is used as a board fixing jig. A wiring board carrying part of carrier 21 is formed using adherent resin 23. Adherent resin 23 preferably has thermal resistance and is reusable by washing, like Magic Resin etc. Positioning holes 22 are formed at a predetermined spacing around carrier 21. This enables the positioning and transport of divided boards 24. Divided boards 24 separated into a strip-shape are brought in close contact with carrier 21 including adherent resin 23 and secured in a state of in which they are spaced apart. The spacing between the spaced-apart divided boards 24 may be appropriately chosen in accordance with the size of semiconductor chip.

Next, a chip-mounting step and an electrical connection step will be described. FIG. 10A is a schematic diagram to show a state after the chip-mounting step and the electrical connection steps have been completed. Moreover, FIG. 10B is a sectional view when taken along line G-G' in FIG. 10A. In the present embodiment, as with the manufacturing method described in the first embodiment, first the chip-mounting step is performed. Thus, semiconductor chip 4 is mounted onto chip-mounting parts 3 of two wiring boards 2 in such a way as to span two divided boards 24. In the electrical connection step as well, as with the manufacturing method described in first embodiment, a wire bonding step is performed. Through the wire bonding step, connection pad 7 of wiring board 2 and electrode pad 5 of corresponding semiconductor chip 4 are connected by conductive wire 10.

As with the manufacturing method described in first embodiment, the semiconductor chip mounting step and the electrical connection step may be carried out by a flip-chip implementation.

Figure 11A:
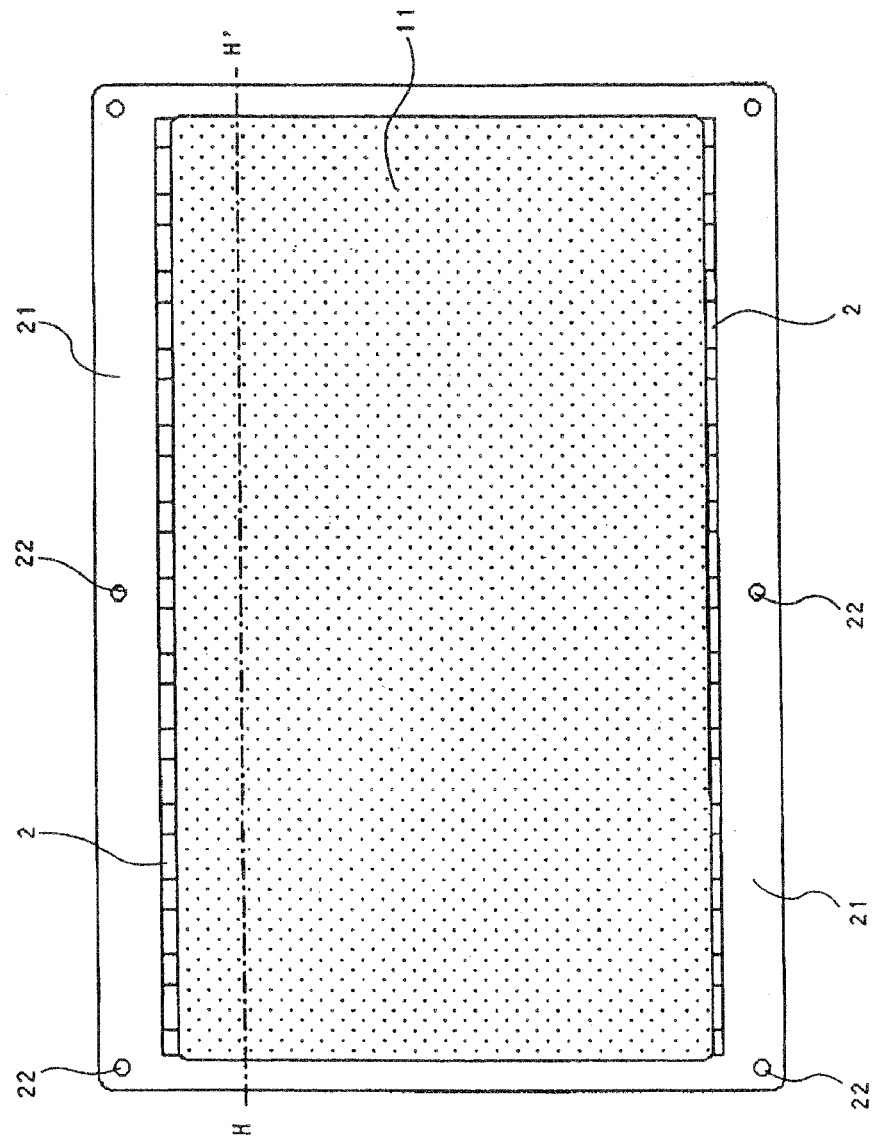
FIG. 11A is a conceptual diagram to show the manufacturing procedure of a semiconductor manufacturing method according to the exemplary embodiment of the present invention.
Figure 11B:
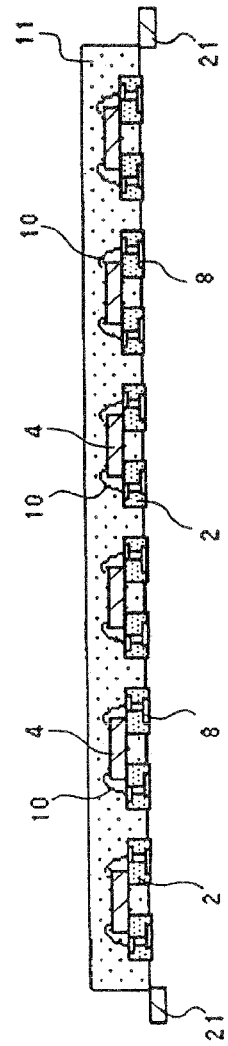
FIG. 11B is a sectional view of FIG. 11A when taken along line H-H' in this figure.

Next, a sealing step will be described. FIG. 11A is a schematic diagram to show a state after the sealing step has been completed. Further, FIG. 11B is a sectional view when taken along line H-H' in FIG. 11A. In the sealing step, as with the manufacturing method described in the first embodiment, sealing part 11 is formed. Sealing part 11 is formed so as to cover semiconductor chip 4, the chip-mounting face of wiring board 2, and the side faces of wiring board 2. After the sealing part is formed, wiring board 2 is detached from carrier 21.

Finally, an external terminal mounting step and a board division step will be described. In the present embodiment as well, the external terminal mounting step and the board division step can be performed in the same manner as with the manufacturing method of the above described semiconductor device described in the first embodiment.

In the disposition step, the use of a carrier including an adherent resin obviates the need to provide a board-fixing holding part on the wiring motherboard. Therefore, it is possible to further increase the number of semiconductor devices to be obtained from one wiring motherboard.

Although the above described embodiments have been described based on BGA type semiconductor devices, the present invention may be applied to semiconductor packages, which include a step of sealing a plurality of semiconductor chips in an integral manner, such as a CSP type and a QFN type packages.

Further, in the above described embodiments, although a board fixing jig or a carrier including an adherent resin is used to dispose the wiring boards to be spaced apart, any configuration may be used provided that it can dispose wiring boards to be spaced apart.

Further, in the above described embodiments, the semiconductor device has a generally rectangular shape and two wiring boards are spaced apart in approximately parallel with each other. However, the wiring board may have any shape and arrangement provided that the semiconductor chips are mounted onto two wiring boards.

Further, in the above described embodiments, although an embodiment, in which two wiring boards are used for a single semiconductor device, has been described, configuration may be such that three or more wiring boards are used in a single semiconductor device.

In the manufacturing method of semiconductors of the present invention, the order of each step may be changed if it is possible.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device, comprising:
    preparing a wiring motherboard which includes a connection pad on one side and a land electrically connected to said connection pad on the other side;
    a disposition step for dividing said wiring motherboard into a plurality of divided boards, each of which has at least one said wiring board, and for disposing said divided boards to be spaced-apart with each other;
    a chip mounting step for mounting a semiconductor chip onto a plurality of said wiring boards and for mounting said semiconductor chip spanning at least two divided boards;
    an electrical connection step for electrically connecting said connection pads of said wiring board and electrode pads formed on one side of said semiconductor chip;
    a sealing step for forming a sealing part so as to at least cover said semiconductor chip and a semiconductor chip mounting face of said wiring board;
    forming an external terminal in said land; and
    obtaining a plurality of semiconductor devices by cutting said sealing part and said divided board.

2. The method of manufacturing a semiconductor device according to claim 1, wherein
    each of said divided boards has a strip-shape in said disposition step.

3. The method of manufacturing a semiconductor device according to claim 1, wherein
    in said sealing step, said sealing part is formed so as to cover said semiconductor chip, the semiconductor chip mounting face of said wiring board, and an end part of said wiring board.

4. The method of manufacturing a semiconductor device according to claim 1, wherein
    in said disposition step, a plurality of said divided boards are spaced apart by being secured to a fixing jig.

5. The method of manufacturing a semiconductor device according to claim 1, wherein
    in said electrical connection step, said connection pads and said electrode pads are electrically connected by a conductive wire.

6. The method of manufacturing a semiconductor device according to claim 1, wherein
    in said chip mounting step, mounting is performed such that the face of said semiconductor chip which said electrode pads are formed on is opposite the face of said wiring board which said connection pads are formed on, and wherein
    in said electrical connection step, said connection pad and said electrode pad are electrically connected by a bump electrode.

7. A method comprising:
    providing first and second wiring boards separately from each other, the first and second wiring boards including a first surface, a second surface opposite to the first surface, a first land formed on the second surface of the first wiring board, and a second land formed on the second surface of the second wiring board;
    arranging the first and second wiring boards so as to be spaced apart with each other;
    mounting a semiconductor chip on the respective parts of the first and second wiring boards such that the semiconductor chip is connected at a first electrode pad thereof to the first land of the first wiring board and at a second electrode pad thereof to the second land of the second wiring board, the semiconductor chip being at a center portion thereof over an area between the first and second wiring boards; and forming a sealing part on the first surface of the first and second wiring boards to cover the semiconductor chip.

8. The method according to claim 7, wherein the first and second wiring boards are spaced apart by being secured to a fixing jig.

9. The method according to claim 7, wherein the first electrode pad of the semiconductor chip is electrically connected with the first land of the first wiring board through a conductive wire, and the second electrode pad of the semiconductor chip is electrically connected with the second land of the second wiring board through the conductive wire.

10. The method according to claim 7, wherein first electrode pad of the semiconductor chip is electrically connected with the first land of the wiring boards through a bump electrode, and the second electrode pad of the semiconductor chip is electrically connected with the second land of the wiring board through the bump electrode.

11. The method according to claim 7, wherein the semiconductor chip is mounted on respective part of the first and second wiring boards so as to span the first and second the wiring boards.

12. The method according to claim 7, further comprising:
mounting a first conductive ball on the first land of the first wiring board and a second conductive ball on the second land of the second wiring board.

13. The method according to claim 7, wherein the sealing part is formed on the first surface of the first and second wiring boards and an end part of the first and second wiring boards.

14. A method comprising:
arranging a plurality of wiring boards in an array form, each of the wiring boards including thereon a plurality of land electrodes, and the wiring boards being divided into plural sets each including at least two of the wiring boards;
providing a plurality of semiconductor chips, each of the semiconductor chips including a plurality of first chip electrodes and a plurality of second chip electrodes;
mounting the semiconductor chips over the wiring boards such that each of the semiconductor chips is electrically connected at the first chip electrodes thereof to the land electrodes of one of an associated one of the plural sets and at the second chip electrodes to the land electrodes of another of the associated one of the plural sets.

15. The method as claimed in claim 14, further comprising encapsulating each of the semiconductor chips together with the associated one of the plural sets.

* * * * *